United States Patent
Buchanan

(10) Patent No.: US 7,516,377 B1
(45) Date of Patent: Apr. 7, 2009

(54) SYSTEM AND METHOD FOR TESTING AN ON-CHIP INITIALIZATION COUNTER CIRCUIT

(75) Inventor: Benjamin C. Buchanan, Duluth, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 507 days.

(21) Appl. No.: 11/344,719

(22) Filed: Feb. 1, 2006

(51) Int. Cl.
 *G01R 31/28* (2006.01)
 *G06F 3/00* (2006.01)
 *G06F 3/048* (2006.01)

(52) U.S. Cl. .................. 714/726; 714/733; 714/706

(58) Field of Classification Search .............. 714/707, 714/724, 726, 733, 734, 30, 799, 812, 706, 714/704; 377/15, 28–29, 33, 39
See application file for complete search history.

(56) References Cited

U.S. PATENT DOCUMENTS

| | | | | |
|---|---|---|---|---|
| 5,983,009 A | * | 11/1999 | Lepejian et al. | 716/18 |
| 6,160,428 A | * | 12/2000 | Pasqualini | 327/142 |
| 6,212,645 B1 | * | 4/2001 | Tjandrasuwita | 713/330 |

\* cited by examiner

*Primary Examiner*—Phung M Chung

(57) ABSTRACT

An apparatus and method is disclosed for providing automated testing for an on-chip initialization counter circuit that comprises a plurality of counter flip-flop circuits that are used in the initialization of an integrated circuit. The apparatus comprises a state machine and a state machine counter circuit. The state machine receives signals from the initialization counter circuit and utilizes the signals to create a built-in self test output signal that indicates a current state within the initialization counter circuit. The state machine is capable of testing various operational states of an initialization counter circuit.

21 Claims, 9 Drawing Sheets

SYSTEM AND METHOD FOR TESTING AN ON-CHIP INITIALIZATION COUNTER CIRCUIT

TECHNICAL FIELD OF THE INVENTION

The present invention is generally directed to power up initialization circuitry for use in integrated circuits and, in particular, to a system and method for testing an on-chip initialization counter circuit.

BACKGROUND OF THE INVENTION

Integrated circuits are usually powered by an external power supply that provides a suitable operating voltage. When an integrated circuit chip is powered up, the power supply voltage rises from zero volts to a specified direct current (DC) operating voltage. The time interval during the rise of the power supply voltage signal is referred to as a "power-on reset interval." During the power-on reset interval all components of an integrated circuit chip must be placed into correctly initialized states so that the integrated circuit chip will function properly when the power supply voltage reaches its operating voltage.

In an integrated circuit system that utilizes a crystal oscillator the power-on reset interval must be extended until the crystal has "warmed up" and has begun to oscillate at the correct frequency. For this reason an integrated circuit with an oscillator system may have an "on-chip initialization circuit" that operates during the power-on reset interval. The on-chip initialization circuit is capable of operating with a power supply voltage signal that has not yet reached its proper operating voltage.

One such prior art on-chip initialization circuit is described in U.S. Pat. No. 6,160,428 issued on Dec. 12, 2000 to Ronald Pasqualini. The Pasqualini patent describes a trigger circuit that is capable of providing an initialization signal to the state-dependent elements (e.g., flip flop circuits) of an integrated circuit. The Pasqualini patent also describes a "warm up" counter 602 that is used to generate a required delay for a crystal oscillator to reach its correct operating frequency.

The Pasqualini patent also describes a method for testing the crystal "warm up" delay counter 602. The twenty four (24) bit delay counter 602 is divided into two twelve (12) bit sub-counters. The two sub-counters are tested by traversing only two (2) times $2^{12}$ states (=$2^{13}$ states) (i.e., 8,192 states) as compared with traversing $2^{24}$ states (~16 million states) for a twenty four (24) bit counter. The sub-counter test method reduces the test time of the initialization counter by a factor of approximately two thousand (2,000). For example, for a fifty megaHertz (50 MHz) clock the test time would be reduced from thirty two hundredths of a second (0.32 sec) to one hundred sixty (160) microseconds sec).

The Pasqualini method requires the use of additional circuitry that must be added to facilitate the accelerated testing of the crystal "warm up" delay counter 602.

There is a need in the art for a system and method that is capable of providing efficient testing of an on-chip initialization circuit. In particular, there is a need in the art for a system and method that is capable of providing an automated testing procedure for an on-chip initialization circuit.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 13, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged initialization counter circuit.

Figure 1:
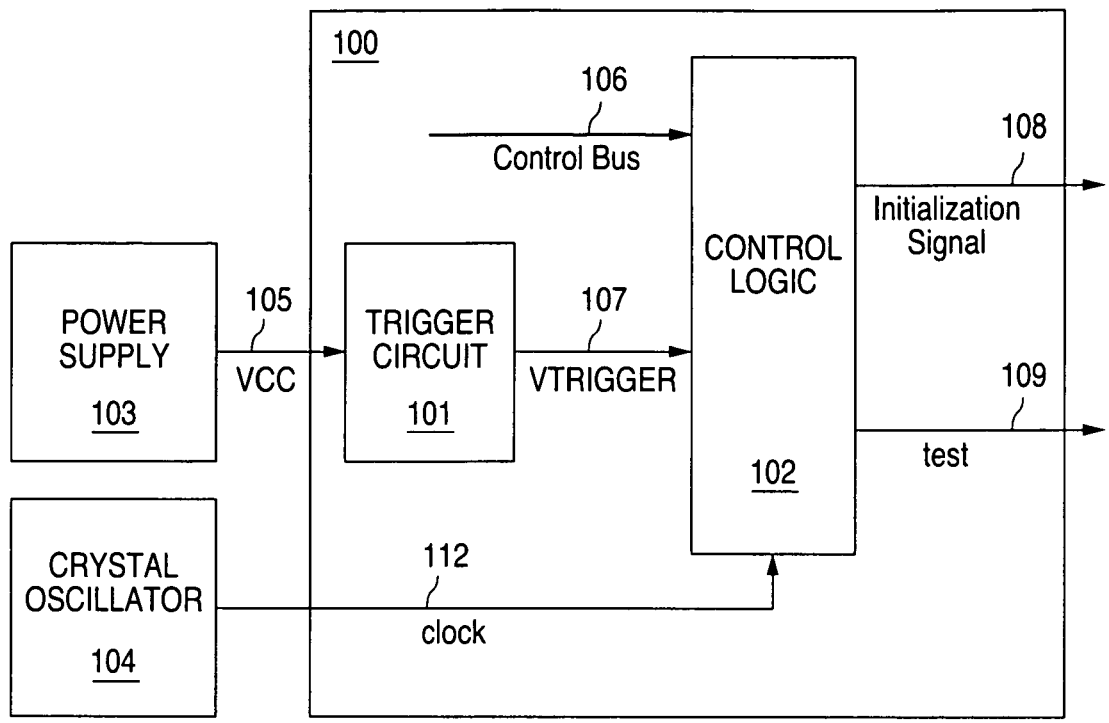
FIG. 1 illustrates a schematic circuit diagram of a prior art on-chip initialization circuit for initializing an integrated circuit chip.

FIG. 1 illustrates a schematic circuit diagram of a prior art on-chip initialization circuit 100 for initializing an integrated circuit chip (not shown). The initialization circuit 100 is substantially the same as the initialization circuit that is described in the previously mentioned Pasqualini patent. The initialization circuit 100 comprises a trigger circuit 101 having an input line 105 connected to an external power supply 103. Trigger circuit 101 is connected to a control logic block 102 via an output line 107. Trigger circuit 101 generates an active low initialization voltage signal Vtrigger at output line 107 and provides the Vtrigger voltage signal to the control logic block 102. The control logic block 102 is connected to external circuitry through control bus 106 and through output lines 108 and 109.

An on-chip crystal oscillator 104 provides a "clock" signal to the control logic block 102 on signal line 112. The control logic block 102 generates the "warm up" delay that is required by the on-chip crystal oscillator 104. The control logic block 102 also outputs a "test" signal on output line 109. The "test" signal allows a crystal "warm up" delay circuit (also referred to as an "initialization counter circuit") to be quickly tested. The test is accomplished without increasing the operating speed of the crystal "warm up" delay circuit.

Figure 2:
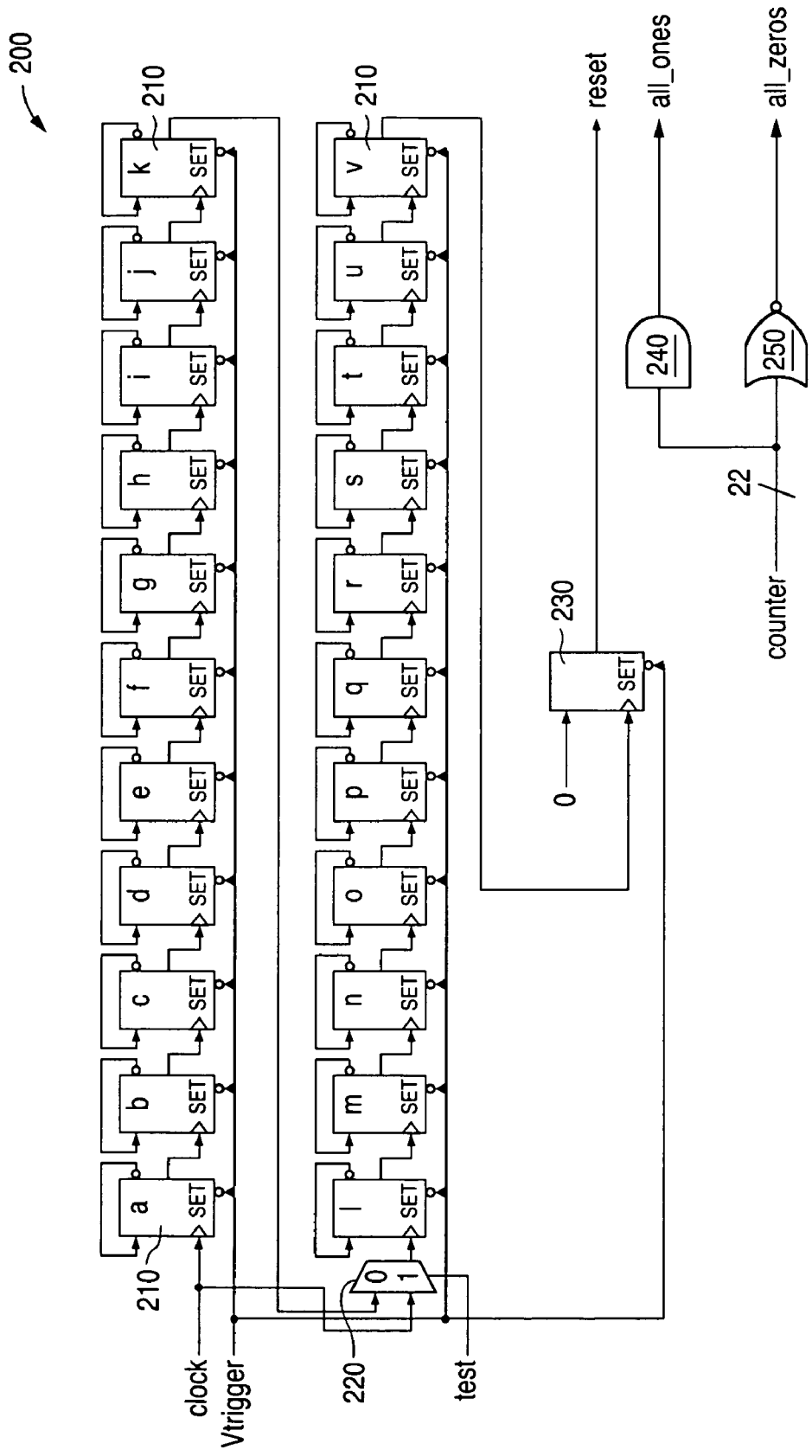
FIG. 2 illustrates a schematic circuit diagram of a prior art initialization counter circuit that is used in an on-chip initialization circuit.

FIG. 2 illustrates a circuit diagram of a prior art initialization counter circuit 200 (or crystal "warm up" delay circuit 200) that may be used in an on-chip initialization circuit. The initialization counter circuit 200 is implemented as a twenty-two (22) bit ripple counter. It is understood that initialization counter circuit 200 is exemplary and that the present invention is not limited to use with a twenty-two (22) bit ripple counter. The present invention may be used with any ripple counter that has an even number of bits.

Initialization counter circuit 200 comprises twenty-two flip-flop circuits (210a to 210v) coupled together in a ripple counter arrangement. Initialization counter circuit 200 also comprises a clock multiplexer 220, a reset flip-flop circuit 230, an AND circuit 240, and a NOR circuit 250. For simplicity and clarity, only three of the twenty-two flip-flop circuits (210a to 210v) are shown having a reference numeral 210.

The twenty-two flip-flop circuits 210 (210a to 210v) and the reset flip-flop circuit 230 each have an asynchronous set connected to the active low output (Vtrigger) of the trigger circuit 101 (not shown in FIG. 2). The clock input of the first flip-flop circuit 210a is connected to the clock signal from crystal oscillator 104 (not shown in FIG. 2). In normal operation the twenty-two (22) bit ripple counter of the initialization counter circuit 200 stretches the Vtrigger event for $(2^{22}-1)$ oscillation clock cycles.

A clock multiplexer 220 is placed between the first eleven flip-flop circuits (210a to 210k) and the second eleven flip-flop circuits (210l to 210v). A first input to the clock multiplexer 220 at the input designated zero ("0") is the output of the eleventh flip-flop circuit 210k. A second input to the clock multiplexer 220 at the input designated one ("1") is the clock signal from crystal oscillator 104.

The operation of the clock multiplexer 220 is controlled by a "test" signal. The "test" signal must be valid (i.e., "high") before the clock signal is enabled. The signal line for the "test" signal can be connected to any external circuitry that is independent of the "reset" output of the initialization counter circuit 220. The value of the "test" signal is zero ("0") for the normal operation mode and is one ("1") for the testing operation mode.

The clock input of the reset flip-flop circuit 230 receives the output of the last (i.e., the twenty second) flip-flop circuit 210v. The other input of the reset flip-flop circuit 230 always receives a zero ("0") signal. The output of the reset flip-flop circuit 230 is a "reset" signal.

The signal designated "counter" in FIG. 2 is a twenty two (22) bit signal in which each bit represents the output of one of the twenty two (22) flip-flop circuits (210a to 210v). The "counter" signal is provided to an AND circuit 240. When all of the bits in the "counter" signal are one ("1") the AND circuit 240 outputs a signal on a signal line that is designated "all_ones".

The "counter" signal is also provided to a NOR circuit 250. When all of the bits in the "counter" signal are zero ("0") the NOR circuit 250 outputs a signal on a signal line that is designated "all_zeros".

Figure 3:
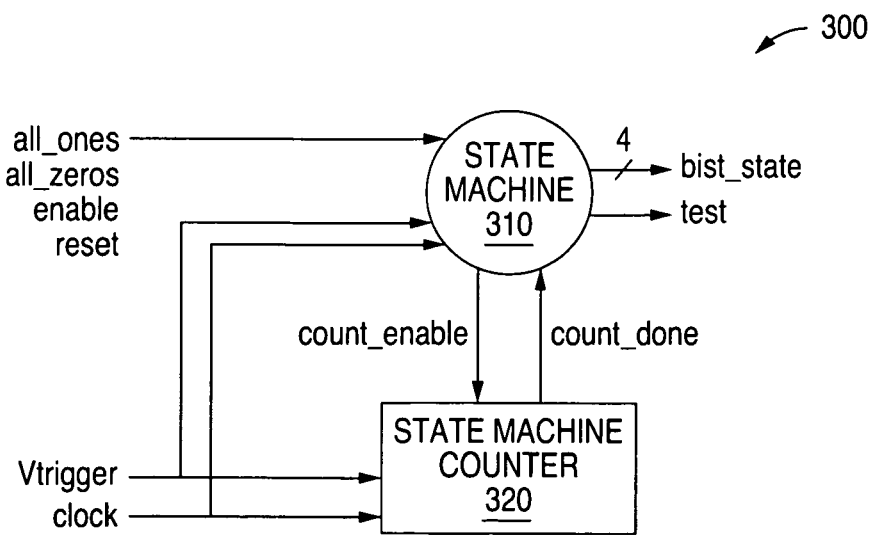
FIG. 3 illustrates a diagram of a Built-In Self Test (BIST) module of the present invention.

FIG. 3 illustrates a diagram of a Built-In Self Test (BIST) module 300 of the present invention. The BIST module 300 comprises a state machine 310 and a state machine counter 320. The state machine 310 receives input signals from the initialization counter circuit 200 shown in FIG. 2. The input signals are: (1) an "all_ones" signal, and (2) an "all_zeros" signal, and (3) a "reset" signal, and (4) an "enable" signal, and (5) a "Vtrigger" signal, and (6) a "clock" signal.

The state machine counter 320 comprises an eleven (11) bit binary "up" counter that has an asynchronous reset and hold at two thousand forty five (2045). The state machine counter 320 receives the "Vtrigger" signal and the "clock" signal from the initialization counter circuit 200.

As shown in FIG. 3, the state machine 310 is coupled to the state machine counter 320. The state machine 310 provides a "count_enable" signal to the state machine counter 320 to initiate a count in the state machine counter 320. After state machine counter 320 has completed its count, then state machine counter 320 sends a "count_done" signal to the state machine 310.

As also shown in FIG. 3, the state machine 310 has two outputs. The first output is a four (4) bit "bist_state" output signal. As will be described more fully below, the four bits in the "bist_state" output signal indicate the current state within the state machine 310. The second output signal from the state machine 310 is a "test" signal. The function of the "test" signal will be described below in conjunction with a description of the operation of the state machine 310.

The outputs of the state machine 310 are only valid when the Vtrigger signal is high (i.e., deasserted) and the "test" signal is high (i.e., asserted) before the clock starts running. For this reason, a valid test configuration of the initialization counter circuit 200 must incorporate a controllable clock.

Figure 4:
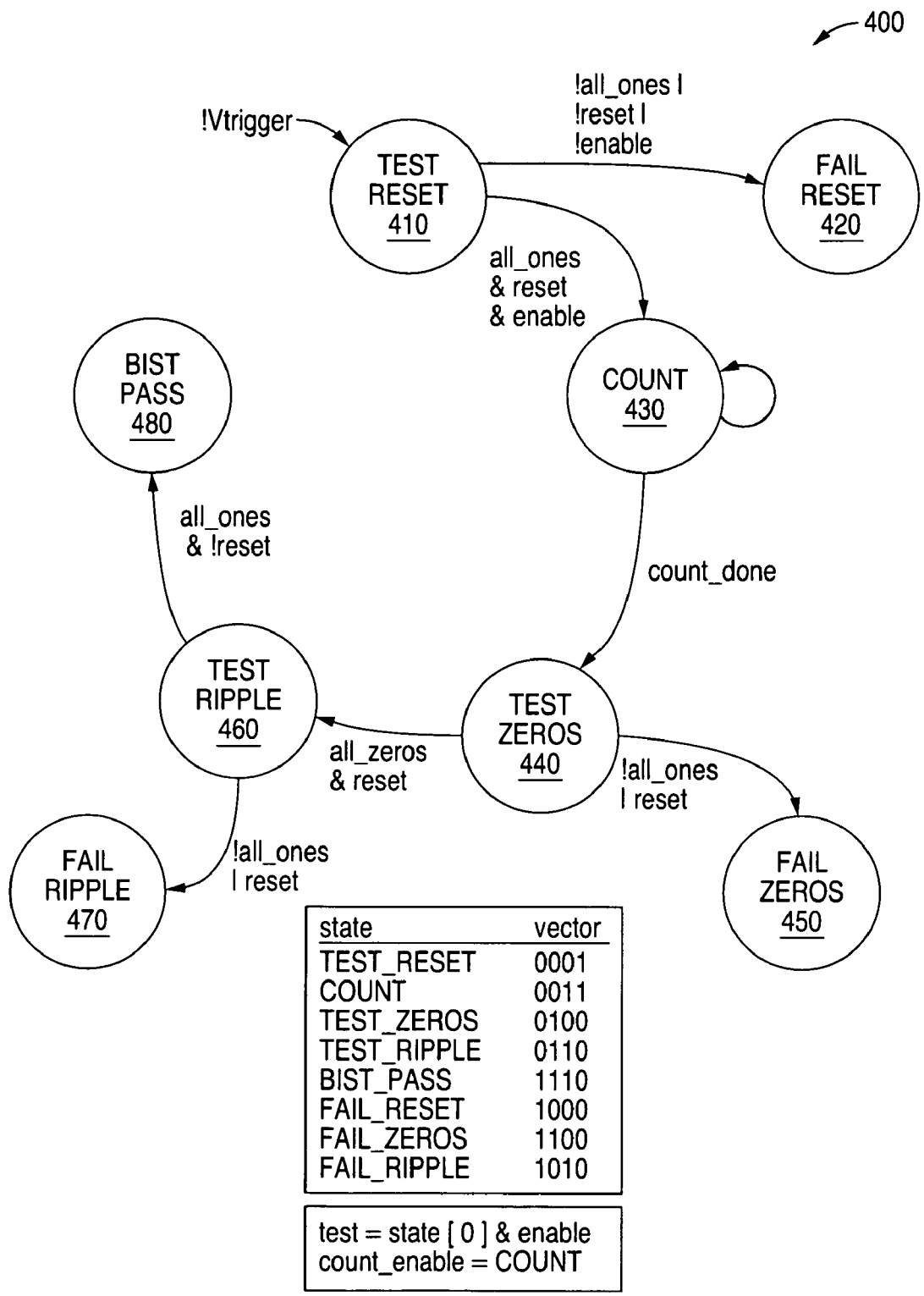
FIG. 4 illustrates a diagram showing the operation of a state machine of the Built-In Self Test (BIST) module of the present invention.

FIG. 4 illustrates a diagram 400 showing the operation of the state machine 310 of the BIST module 300 of the present invention. The state machine 310 is held in reset asynchronously by the Vtrigger output of the trigger circuit 101. Once the Vtrigger output is deasserted and the first clock pulse occurs, the TEST_RESET state 410 verifies that all flip-flop circuits 210 in the counter 200 plus the reset flip-flop circuit 230 were set asynchronously by the trigger circuit 101. If the BIST module 300 is not enabled or the test fails, then the state machine 310 exits to the FAIL_RESET state 420.

Also in the TEST_RESET state 410, the "test" output is asserted if the "enable" signal is true, thus allowing the initialization counter circuit 200 to be split into the configuration of two sub-counters. The first sub-counter comprises the first eleven (11) flip-flop circuits (210a to 210k) and the second sub-counter comprises the second eleven (11) flip-flop circuits (210l to 210v).

If the test in the TEST_RESET state 410 passes, then the state machine 310 exits to the COUNT state 430. The COUNT state 430 enables the state machine counter 320 to begin a count. The state machine counter 320 reaches a maximum at a count of two thousand forty five (2045) cycles and causes the state machine 310 to exit to the TEST_ZEROS state 440. The "test" signal is also asserted in the TEST_ZEROS state 440 to allow both halves of the initialization counter circuit 200 to count down in parallel.

In the TEST_ZEROS state 440, the BIST module 300 verifies that (1) all twenty-two of the flip-flop circuits (210a to 210v) are all zero, and that (2) the reset flip-flop circuit 230 is still asserted (i.e., has a value of one ("1")). If the test in the TEST_ZEROS state 440 fails, the state machine 310 exits to the FAIL_ZEROS state 450. If the test in the TEST_ZEROS state 440 passes, the state machine 310 exits to the TEST_RIPPLE state 460. The "test" output signal is deasserted from this point forward so that the remainder of the test will test a ripple through the entire ripple counter of initialization counter circuit 200 (i.e., will test all twenty-two (22) flip-flop circuits (210a to 210v) sequentially and not in a two sub-counter configuration).

The TEST_RIPPLE state 460 verifies that the final propagation of "ones" through the entire ripple was successful. The success of the ripple process is confirmed if all twenty-two (22) of the flip-flop circuits (210a to 210v) are set at one ("1") and the reset flip-flop circuit 230 is set at zero ("0"). If the test in the TEST_RIPPLE state 460 fails, the state machine 310 exits to the FAIL_RIPPLE state 470. If the test in the TEST_RIPPLE state 460 passes, the state machine 310 exits to the BIST_PASS state 480. The state machine diagram 400 shown in FIG. 4 illustrates the various inputs that are provided to each of the states of the state machine 310.

Each BIST state vector in the state machine 310 (designated "bist_state") is represented by four (4) bits. The four (4) bit representations of the "bist_state" vectors in the state machine 310 are as set forth in the following table:

TABLE ONE

| BIST STATE | BIST STATE VECTOR |
|---|---|
| TEST_RESET 410 | 0001 |
| COUNT 430 | 0011 |
| TEST_ZEROS 440 | 0100 |
| TEST_RIPPLE 460 | 0110 |
| BIST_PASS 480 | 1110 |
| FAIL_RESET 420 | 1000 |
| FAIL_ZEROS 450 | 1100 |
| FAIL_RIPPLE 470 | 1010 |

Note that each "bist_state" vector in the state machine 310 has unique encodings for the upper three bits. During operations the state machine 310 of the BIST module 300 monitors the values of the "bist_state" vectors. The state machine 310 outputs the "bist_state" vectors to external circuitry to provide information concerning the status of the state machine 310.

Because the "test" signal controls the clock multiplexer 220 in the initialization counter circuit 200 the "test" signal must be free from glitches. The "test" signal is enabled when the "bist_state" vector is all zeros ("0000") and the "enable" signal is set. Symbolically this condition may be represented as: test=state [0] & enable.

The "count_enable" signal that the state machine 310 provided to state machine counter 320 is the "bist_state" vector for the COUNT state 430 (i.e., "0011"). Symbolically this condition may be represented as: count_enable=COUNT.

The BIST module 300 is capable of handling a number of different conditions that may occur in the initialization counter circuit 200. For example, if the Vtrigger output of the trigger circuit 101 is stuck asserted, then the state machine 310 will not exit from the TEST_RESET state 410.

If the Vtrigger output of the trigger circuit 101 was never asserted then the TEST_RESET test 410 will fail and the state machine 310 will exit to the FAIL_RESET state 420. This is because the twenty-two (22) counter flip-flop circuits (210a to 210v) will not have been asynchronously set.

The BIST module 300 ensures that all connections in the initialization counter circuit 200 are intact. The TEST_ZEROS state 440 ensures that both halves of the initialization counter circuit 200 are simultaneously counted down to zero ("0"). If this does not occur, then the failure is indicated when the state machine 310 enters the FAIL_ZEROS state 450.

The TEST_RIPPLE state 460 ensures that a one ("1") ripples through the entire initialization counter circuit 200 including the reset flip-flop circuit 230. If this does not occur, then the failure is indicated when the state machine 310 enters the FAIL_RIPPLE state 470.

Figure 5:
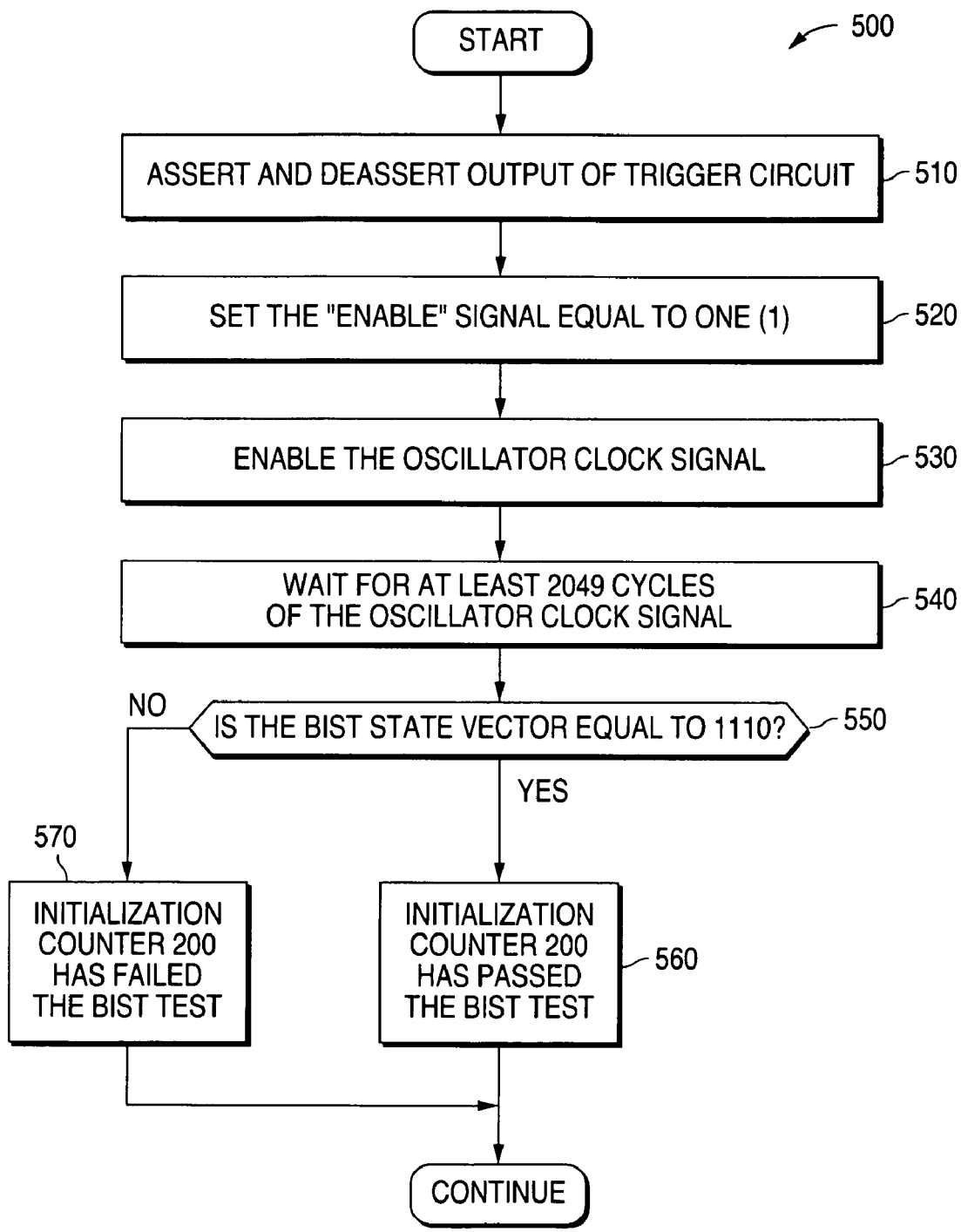
FIG. 5 illustrates a flow chart showing the steps of a first advantageous embodiment of a method of the invention.

FIG. 5 illustrates a flow chart 500 showing the steps of a first advantageous embodiment of a method of the invention. This method uses the BIST module 300 to perform a "Go"/"No Go" test for the initialization counter circuit 200 and to check the results of the test after the test has been completed.

In the first step of the method the output of the trigger circuit 101 (the "Vtrigger" signal) is asserted and deasserted (step 510). Then the "enable" signal is set equal to one ("1") (step 520). Then the oscillator clock signal is enabled (step 530). Then the oscillator clock signal cycles for at least two thousand forty nine (2049) cycles (step 540).

Then a determination is made whether the "bist_state" vector is equal to "1110" (step 550). If the "bist_state" vector is equal to "1110" then the initialization counter circuit 200 has passed the BIST test (step 560). If the "bist_state" vector is not equal to "1110" then the initialization counter circuit 200 has not passed the BIST test (step 570).

Figure 6:
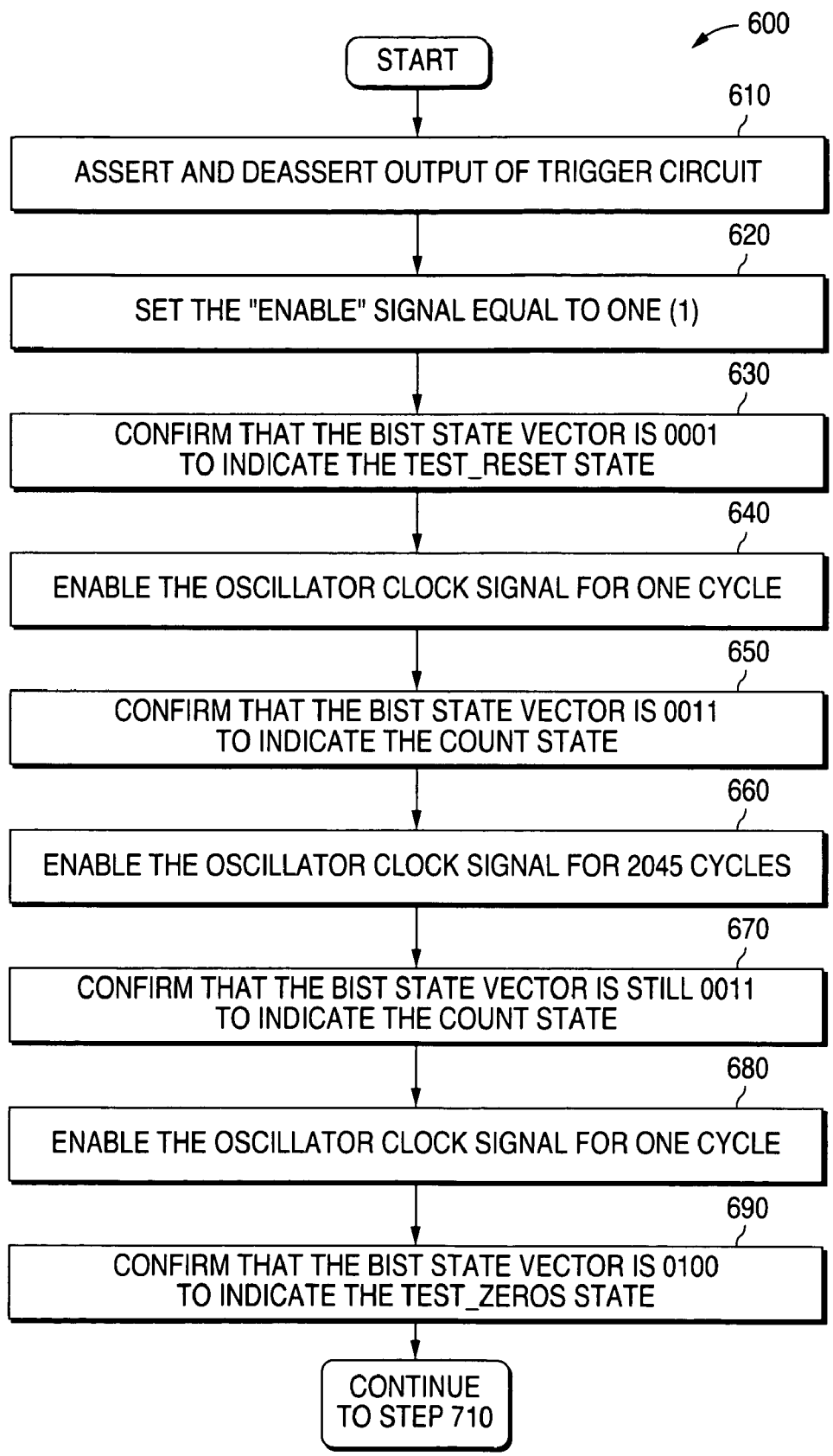
FIG. 6 illustrates a flow chart showing the steps of a first portion of a second advantageous embodiment of a method of the invention.

FIG. 6 illustrates a flow chart 600 showing the steps of a first portion of a second advantageous embodiment of a method of the invention. This method uses the BIST module 300 to perform in a diagnostic mode for debugging the initialization counter circuit 200. In the first step of the method the output of the trigger circuit 101 (the "Vtrigger" signal) is asserted and deasserted (step 610). Then the "enable" signal is set equal to one ("1") (step 620). Then a confirmation is made that the "bist_state" vector is "0001" to indicate that the state machine 310 is in the TEST_RESET state 410 (step 630).

Then the oscillator clock signal is enabled for one cycle (step 640). Then a confirmation is made that the "bist_state" vector is "0011" to indicate that the state machine 310 is in the COUNT state 430 (step 650). Then the oscillator clock signal is enabled for two thousand forty five (2045) cycles (step 660). Then a confirmation is made that the "bist_state" vector is still "0011" to indicate that the state machine 310 is still in the COUNT state 430 (step 670).

Then the oscillator clock signal is enabled for one cycle (step 680). Then a confirmation is made that the "bist_state" vector is "0100" to indicate that the state machine 310 is in the TEST_ZEROS state 440 (step 690). Then control passes to step 710 of the method shown in FIG. 7.

Figure 7:
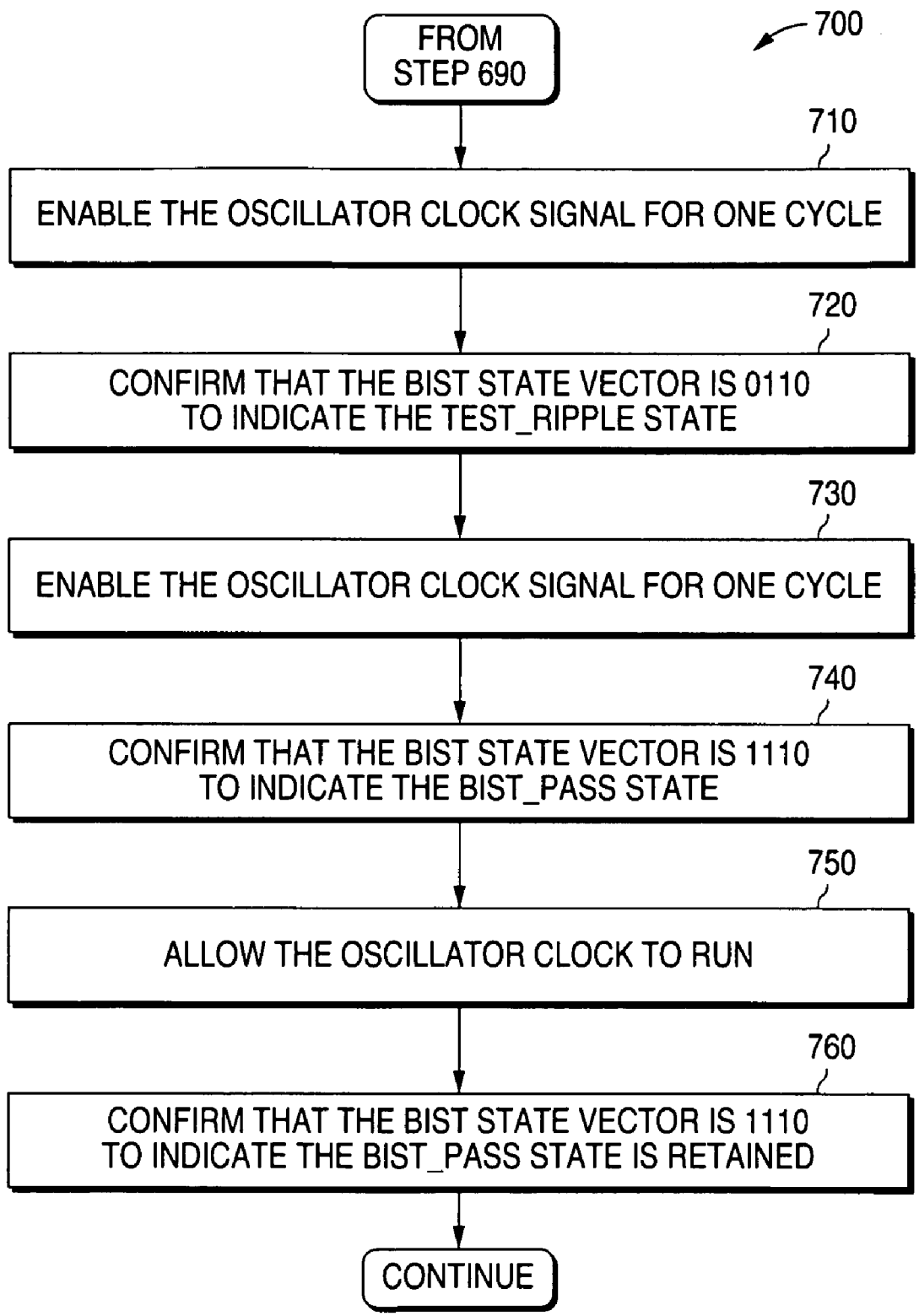
FIG. 7 illustrates a flow chart showing the steps of a second portion of a second advantageous embodiment of a method of the invention.

FIG. 7 illustrates a flow chart 700 showing the steps of a second portion of a second advantageous embodiment of a method of the invention. The control passes from step 690 of the method shown in FIG. 6. The oscillator clock signal is then enabled for one cycle (step 710). Then a confirmation is made that the "bist_state" vector is "0110" to indicate that the state machine 310 is in the TEST_RIPPLE state 460 (step 720).

The oscillator clock signal is then enabled for one cycle (step 730). Then a confirmation is made that the "bist_state" vector is "1110" to indicate that the state machine 310 is in the BIST_PASS state 480 (step 740). Then the oscillator clock is allowed to run (step 750). Then another confirmation is made that the "bist_state" vector is "1110" to indicate that the state machine 310 has retained the BIST_PASS state 480 (step 760).

Figure 8:
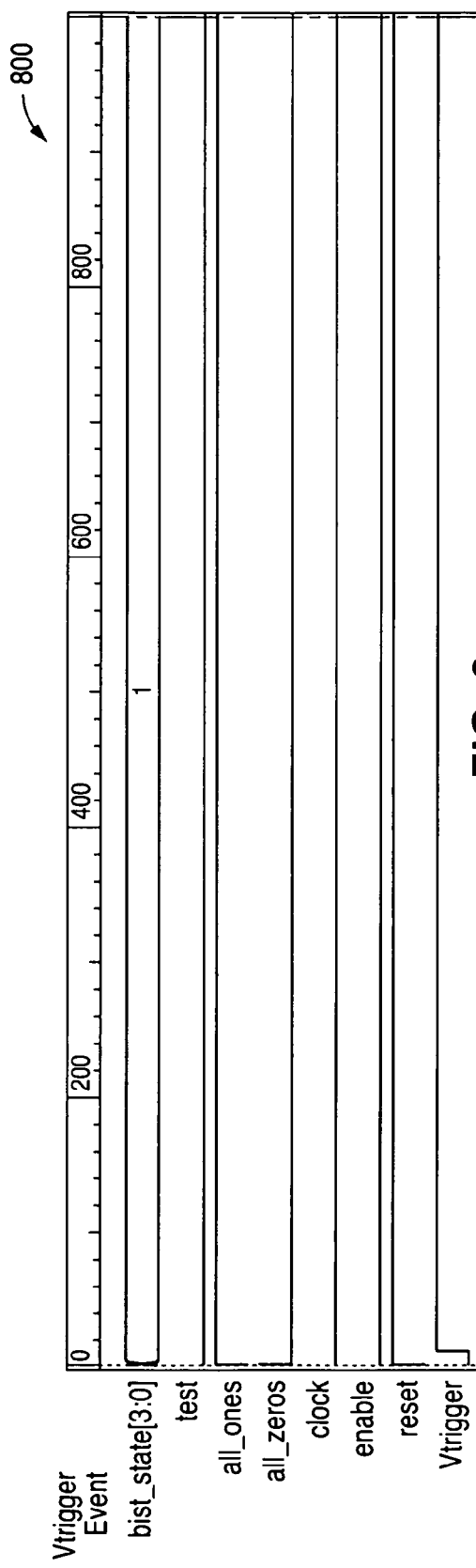
FIG. 8 illustrates a first timing diagram showing a set of signals of the method of the present invention associated with a "Vtrigger" event.

FIG. 8 illustrates a first timing diagram 800 showing a set of signals of the method of the present invention associated with a "Vtrigger" event.

Figure 9:
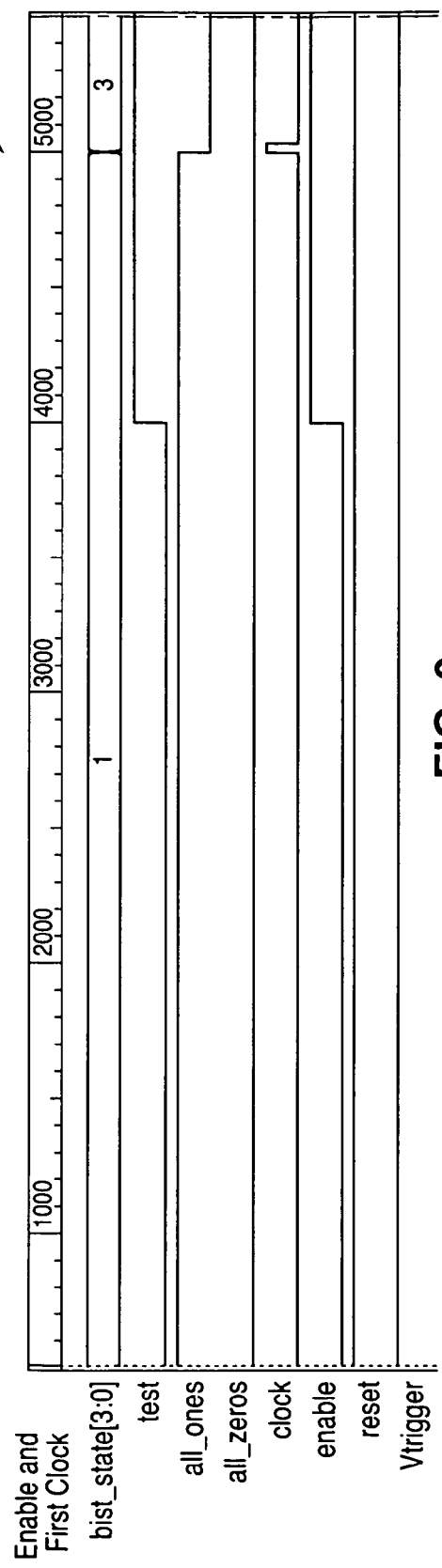
FIG. 9 illustrates a second timing diagram showing a set of signals of the method of the present invention associated with an "Enable and First Clock" event.

FIG. 9 illustrates a second timing diagram 900 showing a set of signals of the method of the present invention associated with an "Enable and First Clock" event.

Figure 10:
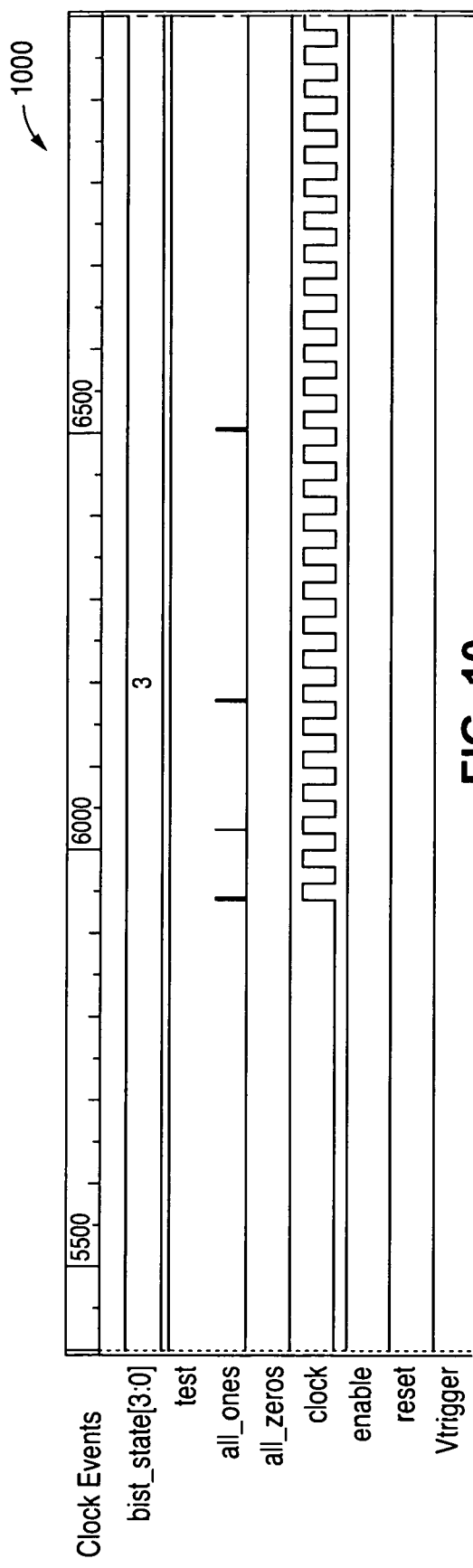
FIG. 10 illustrates a third timing diagram showing a set of signals of the method of the present invention associated with "Clock Events"

FIG. 10 illustrates a third timing diagram 1000 showing a set of signals of the method of the present invention associated with "Clock Events".

Figure 11:
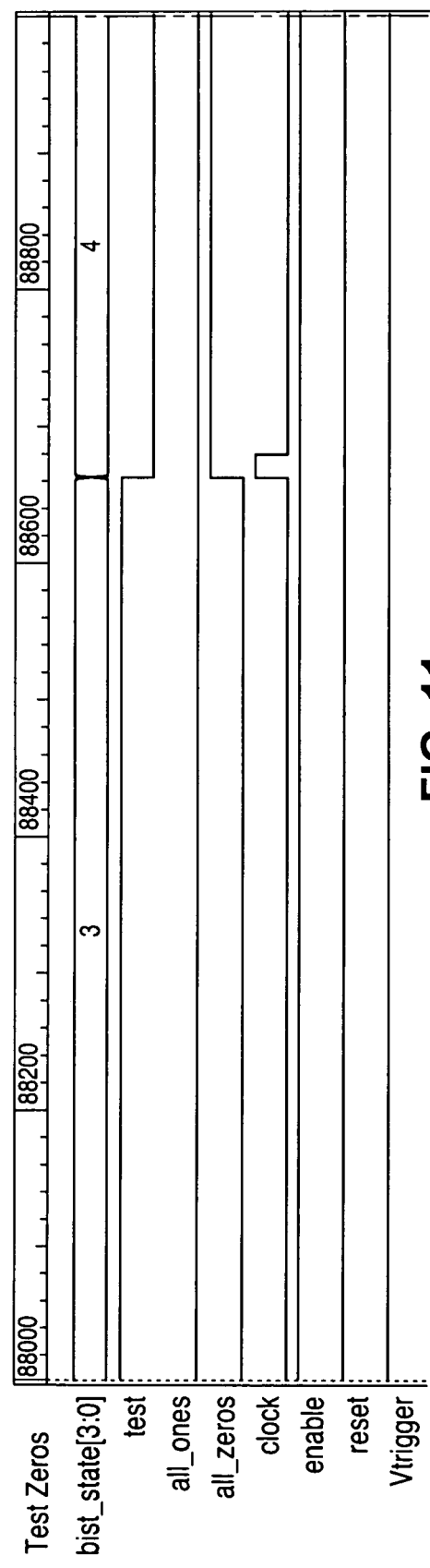
FIG. 11 illustrates a fourth timing diagram showing a set of signals of the method of the present invention associated with a "Test Zeros" event.

FIG. 11 illustrates a fourth timing diagram 1100 showing a set of signals of the method of the present invention associated with a "Test Zeros" event.

Figure 12:
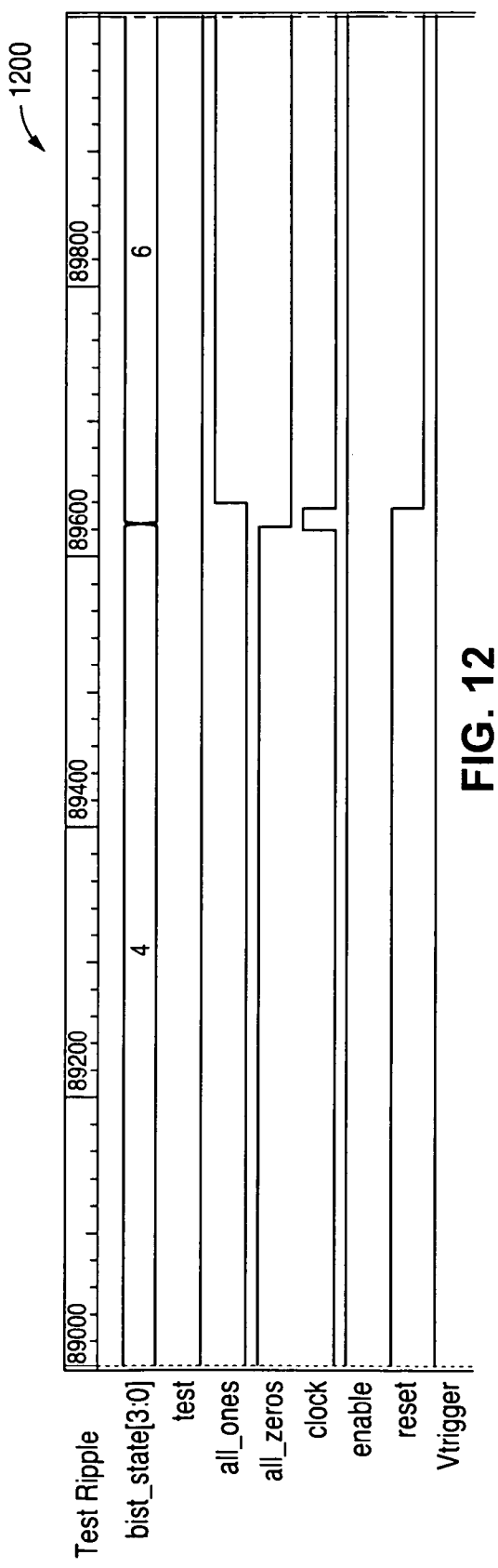
FIG. 12 illustrates a fifth timing diagram showing a set of signals of the method of the present invention associated with a "Test Ripple" event.

FIG. 12 illustrates a fifth timing diagram 1200 showing a set of signals of the method of the present invention associated with a "Test Ripple" event.

Figure 13:
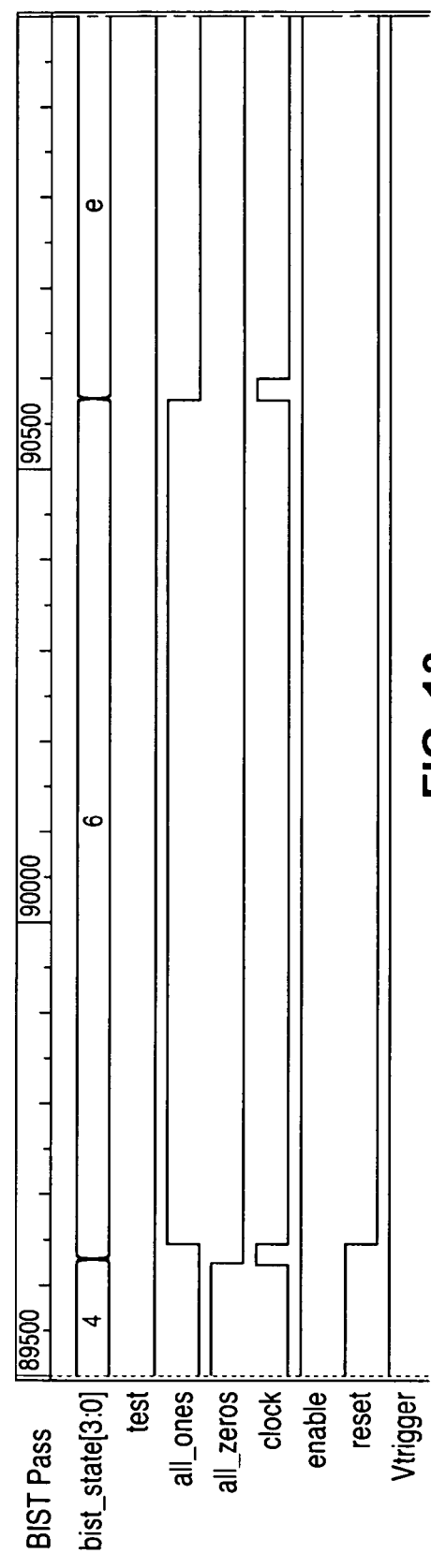
FIG. 13 illustrates a sixth timing diagram showing a set of signals of the method of the present invention associated with a "BIST Pass" event.

FIG. 13 illustrates a sixth timing diagram 1300 showing a set of signals of the method of the present invention associated with a "BIST Pass" event.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. An apparatus for testing an on-chip initialization counter circuit that comprises a plurality of counter flip-flop circuits used in an initialization of an integrated circuit, the apparatus comprising:
   a state machine configured to test a plurality of states of the initialization counter circuit; and
   a state machine counter circuit coupled to the state machine and configured to count a specified number of clock cycles in a clock signal from a crystal oscillator;
   wherein the state machine is configured to test at least one of the states of the initialization counter circuit in response to receiving an indication that the state machine counter circuit has counted the specified number of clock cycles.

2. The apparatus as set forth in claim 1 wherein the initialization counter circuit comprises a ripple counter circuit, the ripple counter circuit comprising an even number of counter flip-flop circuits, wherein a first portion of the counter flip-flop circuits is located within a first sub-counter circuit and a second portion of the counter flip-flop circuits is located within a second sub-counter circuit.

3. The apparatus as set forth in claim 2 wherein the state machine is configured to test states of the first sub-counter circuit and of the second sub-counter circuit.

4. The apparatus as set forth in claim 1 wherein the state machine is configured to receive input signals from the initialization counter circuit, the input signals comprising an initialization voltage signal, a clock signal, an enable signal, a reset signal, an all_ones signal, and an all_zeros signal.

5. An apparatus for testing an on-chip initialization counter circuit that comprises a plurality of counter flip-flop circuits used in an initialization of an integrated circuit, the apparatus comprising:
   a state machine configured to test a plurality of states of the initialization counter circuit; and
   a state machine counter circuit coupled to the state machine;
   wherein the state machine is configured to receive input signals from the initialization counter circuit, the input signals comprising an initialization voltage signal, a clock signal, an enable signal, a reset signal, an all_ones signal, and an all_zeros signal; and
   wherein the state machine is configured to utilize the input signals from the initialization counter circuit to create a built-in self test output signal that indicates a current state of the initialization counter circuit.

6. The apparatus as set forth in claim 5 wherein the built-in self test output signal indicates a current state within the state machine, the current state comprising one of: a TEST_RESET state, a COUNT state, a TEST_ZEROS state, a TEST_RIPPLE state, a BIST_PASS state, a FAIL_RESET state, a FAIL_ZEROS state, and a FAIL_RIPPLE state.

7. The apparatus as set forth in claim 6 wherein the state machine is configured to one of: place the state machine in a FAIL_RESET state if the initialization counter circuit fails a test in the TEST_RESET state, place the state machine in a FAIL_ZEROS state if the initialization counter circuit fails a test in the TEST_ZEROS state, and place the state machine in a FAIL_RIPPLE state if the initialization counter circuit fails a test in the TEST_RIPPLE state.

8. The apparatus as set forth in claim 5 wherein the state machine in a TEST_RESET state is configured to test whether the counter flip-flop circuits in the initialization counter circuit are set asynchronously by the initialization voltage signal.

9. The apparatus as set forth in claim 5 wherein the state machine in a TEST_RESET state is configured to assert a "test" signal if the enable signal is asserted, wherein the assertion of the "test" signal splits the counter flip-flop circuits of the initialization counter circuit into a configuration of two sub-counters.

10. The apparatus as set forth in claim 9 wherein the state machine is configured to enter a COUNT state if the initialization counter circuit passes the TEST_RESET state, wherein the state machine is configured to enable the state machine counter to begin a count during which the two sub-counters count down in parallel.

11. The apparatus as set forth in claim 10 wherein the state machine is configured to enter a TEST_ZEROS state after the state machine counter has reached a maximum count, and wherein the state machine is configured to verify that the counter flip-flop circuits of the initialization counter circuit all have a value of zero and that a reset flip-flop circuit of the initialization counter circuit has a value of one.

12. The apparatus as set forth in claim 11 wherein the state machine is configured to enter a TEST_RIPPLE state if the initialization counter circuit passes the TEST_ZEROS state, and wherein the state machine is configured to deassert the "test" signal and verify that a ripple propagation of values of one is successful through the counter flip-flop circuits of the initialization counter circuit.

13. The apparatus as set forth in claim 12 wherein the ripple propagation of values of one is successful when all of the plurality of counter flip-flop circuits have a value of one and the reset flip-flop circuit has a value of zero.

14. The apparatus as set forth in claim 12 wherein the state machine is configured to enter a BIST_PASS state if the initialization counter circuit passes the TEST_RIPPLE state.

15. The apparatus as set forth in claim 9 wherein the state machine in the TEST_RESET state is configured to assert the "test" signal when the enable signal is asserted and when the built-in self test output signal is zero.

16. A method for testing an on-chip initialization counter circuit that comprises a plurality of counter flip-flop circuits used in an initialization of an integrated circuit, the method comprising the steps of:
    receiving in a state machine a plurality of signals from the initialization counter circuit;
    enabling a state machine counter to count a specified number of clock cycles in a clock signal from a crystal oscillator;
    testing a plurality of states of the initialization counter circuit using the signals, including testing at least one state of the initialization counter circuit in response to receiving an indication that the state machine counter circuit has counted the specified number of clock cycles; and
    creating a built-in self test output signal that indicates a current state of the initialization counter circuit based on the testing.

17. The method as set forth in claim 16 wherein the plurality of signals received by the state machine comprise an initialization voltage signal, a clock signal, an enable signal, a reset signal, an all_ones signal, and an all_zeros signal.

18. A method for testing an on-chip initialization counter circuit that comprises a plurality of counter flip-flop circuits used in an initialization of an integrated circuit, the method comprising the steps of:
    receiving in a state machine a plurality of signals from the initialization counter circuit, the plurality of signals comprising an initialization voltage signal, a clock signal, an enable signal, a reset signal, an all_ones signal, and an all_zeros signal; and
    utilizing the plurality of signals to create a built-in self test output signal that indicates a current state of the initialization counter circuit by:
    testing in a TEST_RESET state of the state machine whether the counter flip-flop circuits in the initialization counter circuit are set asynchronously by the initialization voltage signal; and
    asserting a "test" signal in the TEST_RESET state when the enable signal is asserted, wherein the assertion of the "test" signal splits the counter flip-flop circuits of the initialization counter circuit into a configuration of two sub-counters.

19. The method as set forth in claim 18 wherein utilizing the plurality of signals to create the built-in self test output signal further comprises the steps of:
    entering a COUNT state of the state machine if the initialization counter circuit passes the TEST_RESET state, wherein the state machine enables a state machine counter to begin a count during which the two sub-counters count down in parallel;
    entering a TEST_ZEROS state of the state machine after the state machine counter has reached a maximum count, and
    verifying in the state machine that the counter flip-flop circuits of the initialization counter circuit all have a value of zero and that a reset flip-flop circuit of the initialization counter circuit has a value of one.

20. The method as set forth in claim 19 wherein utilizing the plurality of signals to create the built-in self test output signal further comprises the steps of:
    entering a TEST_RIPPLE state of the state machine if the initialization counter circuit passes the TEST_ZEROS state;
    deasserting the "test" signal in the state machine;
    verifying in the state machine that a ripple propagation of values of one is successful through the counter flip-flop circuits of the initialization counter circuit; and
    entering a BIST_PASS state of the state machine if the initialization counter circuit passes the TEST_RIPPLE state.

21. A method for testing an on-chip initialization counter circuit that comprises a plurality of counter flip-flop circuits used in an initialization of an integrated circuit, the method comprising the steps of:
    receiving in a state machine a plurality of signals from the initialization counter circuit, the plurality of signals comprising an initialization voltage signal, a clock signal, an enable signal, a reset signal, an all_ones signal, and an all_zeros signal; and
    utilizing the plurality of signals to create a built-in self test output signal that indicates a current state of the initialization counter circuit;
    wherein receiving the signals and utilizing the signals comprises:
        asserting the initialization voltage signal;
        deasserting the initialization voltage signal;
        asserting the enable signal;
        enabling the clock signal;
        allowing a selected number of clock cycles to elapse; and
        testing whether the built-in self test output signal of the state machine indicates that the initialization counter circuit is ready for operation.

* * * * *